(12) United States Patent
Shibata

(10) Patent No.: US 7,366,018 B2
(45) Date of Patent: Apr. 29, 2008

(54) SEMICONDUCTOR MEMORY DEVICE CAPABLE OF SETTING A NEGATIVE THRESHOLD VOLTAGE

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 11/300,364

(22) Filed: Dec. 15, 2005

(65) Prior Publication Data

US 2006/0133150 A1    Jun. 22, 2006

(30) Foreign Application Priority Data

Dec. 16, 2004    (JP) .............................. 2004-364902

(51) Int. Cl.
*G11C 16/04*    (2006.01)
(52) U.S. Cl. ........................... 365/185.18; 365/185.17; 365/203
(58) Field of Classification Search ........... 365/185.18, 365/185.17, 203, 149, 189.09
See application file for complete search history.

(56) References Cited

U.S. PATENT DOCUMENTS 5,253,206 A    10/1993    Tanaka et al.

| | | | |
|---|---|---|---|
| 6,195,291 B1* | 2/2001 | Dallabora et al. | 365/185.23 |
| 6,813,187 B2* | 11/2004 | Lee | 365/185.18 |
| 6,888,756 B2* | 5/2005 | Byeon et al. | 365/185.18 |
| 7,031,197 B2* | 4/2006 | Yoshida | 365/185.28 |
| 2004/0170056 A1 | 9/2004 | Shibata et al. | |
| 2005/0035393 A1* | 2/2005 | Lung et al. | 257/314 |
| 2006/0133150 A1 | 6/2006 | Shibata | |

FOREIGN PATENT DOCUMENTS

JP    3-283200    12/1991
JP    2004-192789    7/2004

OTHER PUBLICATIONS

U.S. Appl. No. 11/457,320, filed Jul. 13, 2006, Shibata et al.
U.S. Appl. No. 11/737,413, filed Apr. 19, 2007, Shibata.

* cited by examiner

*Primary Examiner*—David Lam
(74) *Attorney, Agent, or Firm*—Oblon, Spivak, McClelland, Maier & Neustadt, P.C.

(57) ABSTRACT

In a memory cell array, a plurality of memory cells connected to word lines and bit lines are arranged in a matrix. A control circuit controls the potentials of the word lines and bit lines. The control circuit, when reading data from the memory cell connected to a first one of the bit lines, supplies a first voltage to a second bit line provided next to the first bit line and to a source line of the memory cell array.

22 Claims, 15 Drawing Sheets

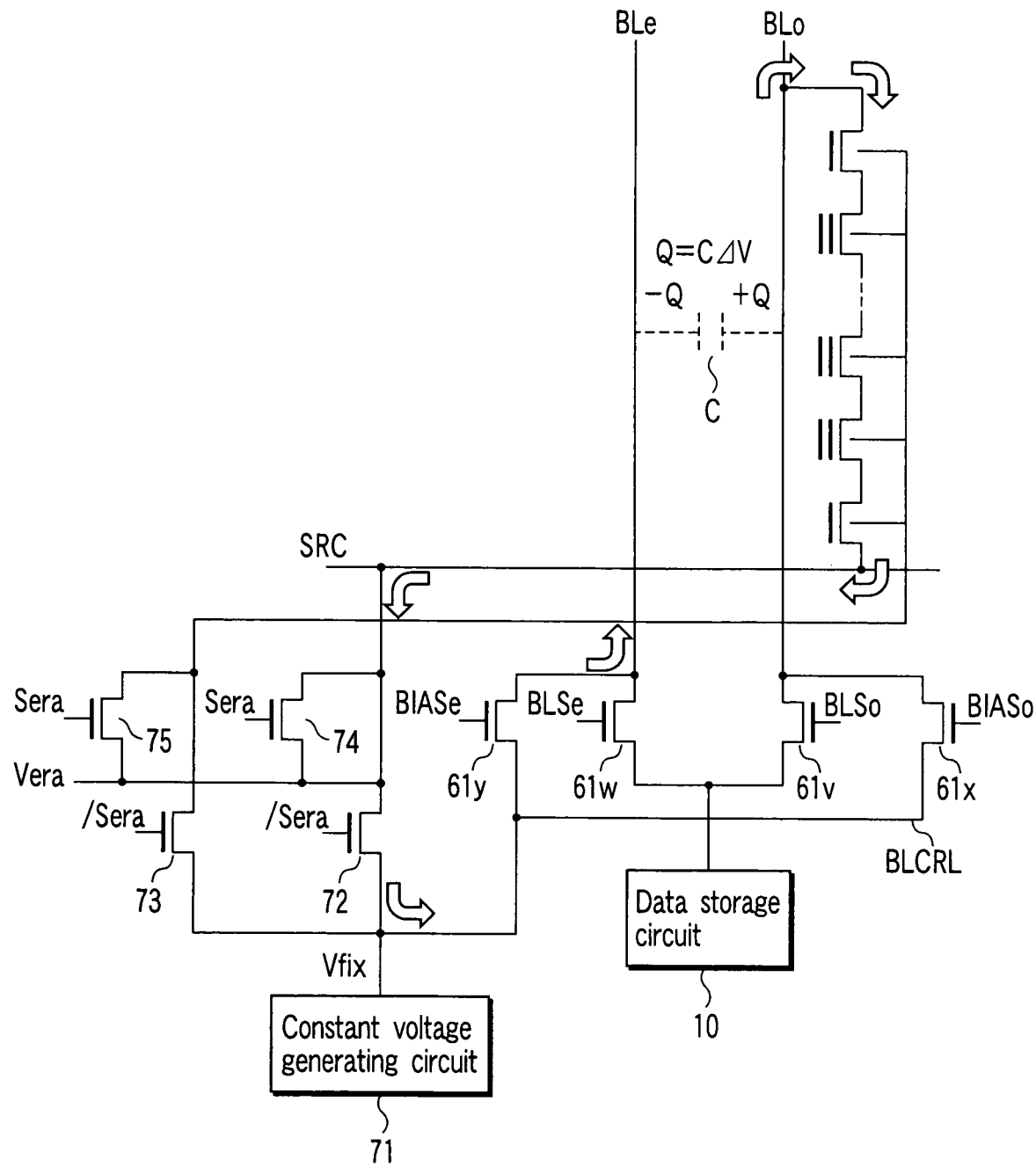
F I G. 1

Memory cell MC

Select gate

| | Cell (P-well) 55 | Cell (N-well) 52 | HVNTr (P-sub) 51 | LVNTr (P-well) 56 | LVPTr (N-well) 53 | HVPTr (N-well) 54 |
|---|---|---|---|---|---|---|
| Erase | Vera (20V) | Vera (20V) | Vss (0V) | Vss (0V) | Vdd (2.5V) | Vdd (2.5V) |
| Program | Vss (0V) | Vss (0V) | Vss (0V) | Vss (0V) | Vdd (2.5V) | Vdd (2.5V)/Vpgmh |
| Positive read | Vss (0V) | Vss (0V) | Vss (0V) | Vss (0V) | Vdd (2.5V) | Vdd (2.5V)/Vreadh |
| Negative read | Vfix(1.6V) | Vfix(1.6V) | | Vss (0V) | Vdd (2.5V) | Vdd (2.5V)/Vreadh+Vfix |

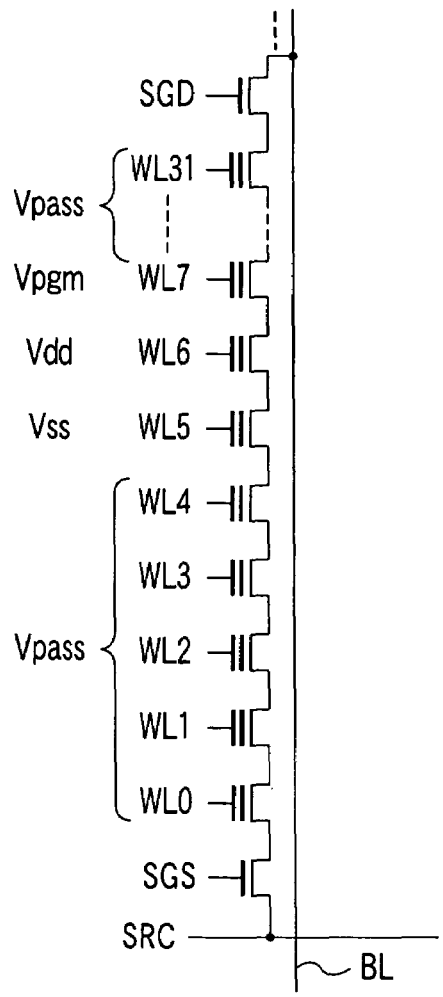
FIG. 14
(Conventional)
(First embodiment)

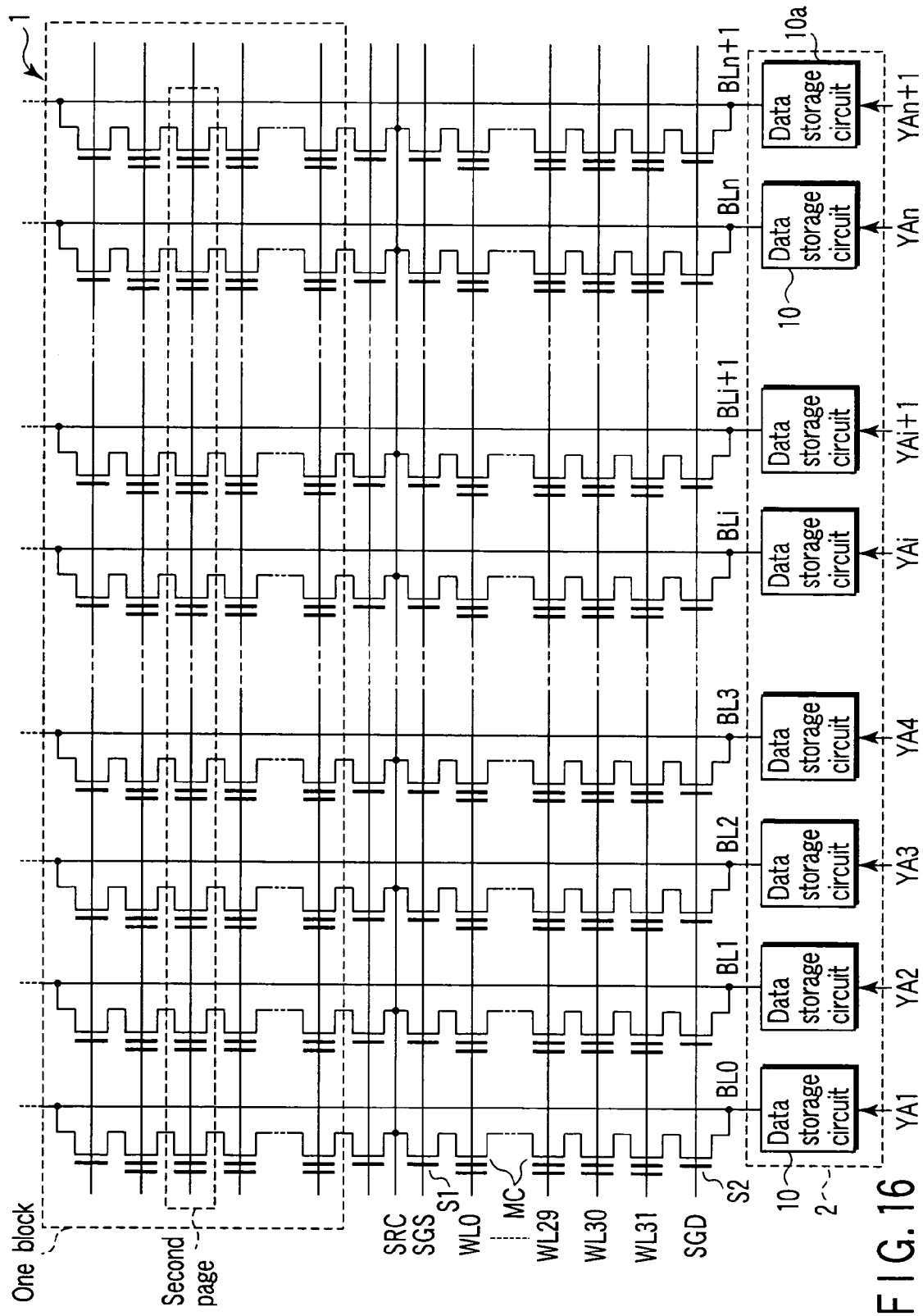
F I G. 16

SEMICONDUCTOR MEMORY DEVICE CAPABLE OF SETTING A NEGATIVE THRESHOLD VOLTAGE

CROSS-REFERENCE TO RELATED APPLICATIONS

This application is based upon and claims the benefit of priority from prior Japanese Patent Application No. 2004-364902, filed Dec. 16, 2004, the entire contents of which are incorporated herein by reference.

BACKGROUND OF THE INVENTION

1. Field of the Invention

This invention relates to a semiconductor memory device capable of storing binary or more-valued data in, for example, a single memory.

2. Description of the Related Art

In a NAND flash memory, all of or half of a plurality of memory cells arranged in the row direction are connected via bit lines to corresponding latch circuits, respectively. Each latch circuit holds data in writing or reading data. Data is written or read all at once into or from all of or half of the cells arranged in the row direction (for example, refer to Jpn. Pat. Appln. KOKAI Publication No. 2004-192789).

In addition, data is erased in, for example, blocks. The threshold voltage of a memory cell is made negative in an erase operation and electrons are injected into the memory cell in a write operation, thereby making the threshold voltage positive. However, since the memory cells are connected in series in a NAND flash memory, the unselected cells have to be in the on state in a read operation. For this reason, a higher voltage (Vread) than the threshold voltage is applied to the gates of the unselected cells. Therefore, the threshold voltage in a write operation must not exceed Vread. In a write sequence, the threshold voltage distribution has to be suppressed so as not to exceed Vread by carrying out a program operation and a program verify read operation. This causes a problem: the speed of the program becomes slower.

To store a large amount of data, a multivalued memory which stores two or more bits in a single cell has been developed. In the multivalued memory, for example, to store two bits in a single cell, four threshold voltages must be set. For this reason, the distribution of one threshold voltage has to be made narrower than in a memory which stores one bit in one cell. In this control, too, a program operation and a program verify operation must be repeated as described above, which causes a problem: the write speed becomes slower.

Moreover, to store 3-bit data or 4-bit data into one cell, 8 or 16 threshold voltages have to be set. For this reason, the threshold width of one threshold voltage must be made very narrow.

To solve this problem, it is conceivable that a threshold voltage is set as data to a negative threshold voltage. In such a configuration, since the number of positive threshold voltages to be set can be decreased in the range of Vread, the distribution width of one threshold voltage can be made wider, enabling high-speed writing. However, when a negative voltage is applied to the gate of the memory cell, a negative potential has to be supplied to a word line. For this reason, a high withstand voltage transistor (H. V. Tr) constituting a row decoder has to be formed in a p-well structure and a negative voltage has to be applied to the well. This causes a problem: the manufacturing process becomes complicated.

To overcome this problem, an external power supply or an internal power supply supplies a bias voltage to the source of the cell and the well in a read and a verify operation, thereby making the potentials of the source and well higher than the potential of the word line. This seemingly produces a situation equivalent to a case where a negative voltage is applied to the word line, thereby reading a negative threshold value. This technique has been proposed (for example, refer to Jpn. Pat. Appln. KOKAI Publication No. 3-283200). However, this technique has been applied to the test mode of memory cells, and not to the normal operation mode. In addition, when the internal power supply circuit applies a bias voltage to the source and well, large currents flow from a large number (16 k to 32 k) of bit lines into the internal power supply circuit, which causes a problem: the internal power supply circuit is unstable. Therefore, a semiconductor memory device capable of setting a negative threshold voltage in a memory cell and operating stably has been desired.

BRIEF SUMMARY OF THE INVENTION

According to a first aspect of the present invention, there is provided a semiconductor memory device comprising: a memory cell array in which a plurality of memory cells are arranged in a matrix, the memory cells being connected to word lines and bit lines; and a control circuit which controls the potentials of the word lines and bit lines and which, when performing a read operation on the memory cell connected to a first one of the bit lines, supplies a first voltage to a second bit line provided next to the first bit line and to a source line of the memory cell array.

According to a second aspect of the present invention, there is provided a semiconductor memory device comprising: a memory cell array in which a plurality of memory cells are arranged in a matrix, the memory cells being connected to word lines and bit lines; a control circuit which controls the potentials of the word lines, the bit lines, a source line, and a well; and a constant voltage generating circuit which generates a first voltage and a second voltage, wherein each of the memory cells has an n number of states, including a first state, a second state, . . . , an n-th state (n is a natural number equal to 2 or more) and the control circuit, when reading the first state, the second state, . . . , a k-th state (k≦n where k is a natural number), supplies the first voltage generated by the constant voltage generating circuit to the source line of the memory cell array and, when reading a (k+1)-th state to the n-th state, supplies the second voltage to the source line of the memory cell.

BRIEF DESCRIPTION OF THE SEVERAL VIEWS OF THE DRAWING

FIG. 1 is a circuit diagram showing the main part of a semiconductor memory device according to a first embodiment of the present invention;

FIG. 6 is a table listing voltages supplied to various parts in various operations in the configuration of FIG. 5;

FIGS. 8A, 8B, and 8C show the relationship between the data in a memory cell and the threshold voltages of the memory cell;

FIG. 14 shows a writing method of self-boosting an erase region;

FIG. 16 shows the configuration of the memory cell array 1 and data storage circuit 10 according to a fourth embodiment of the present invention;

DETAILED DESCRIPTION OF THE INVENTION

Hereinafter, referring to the accompanying drawings, embodiments of the present invention will be explained.

FIRST EMBODIMENT

Figure 2:
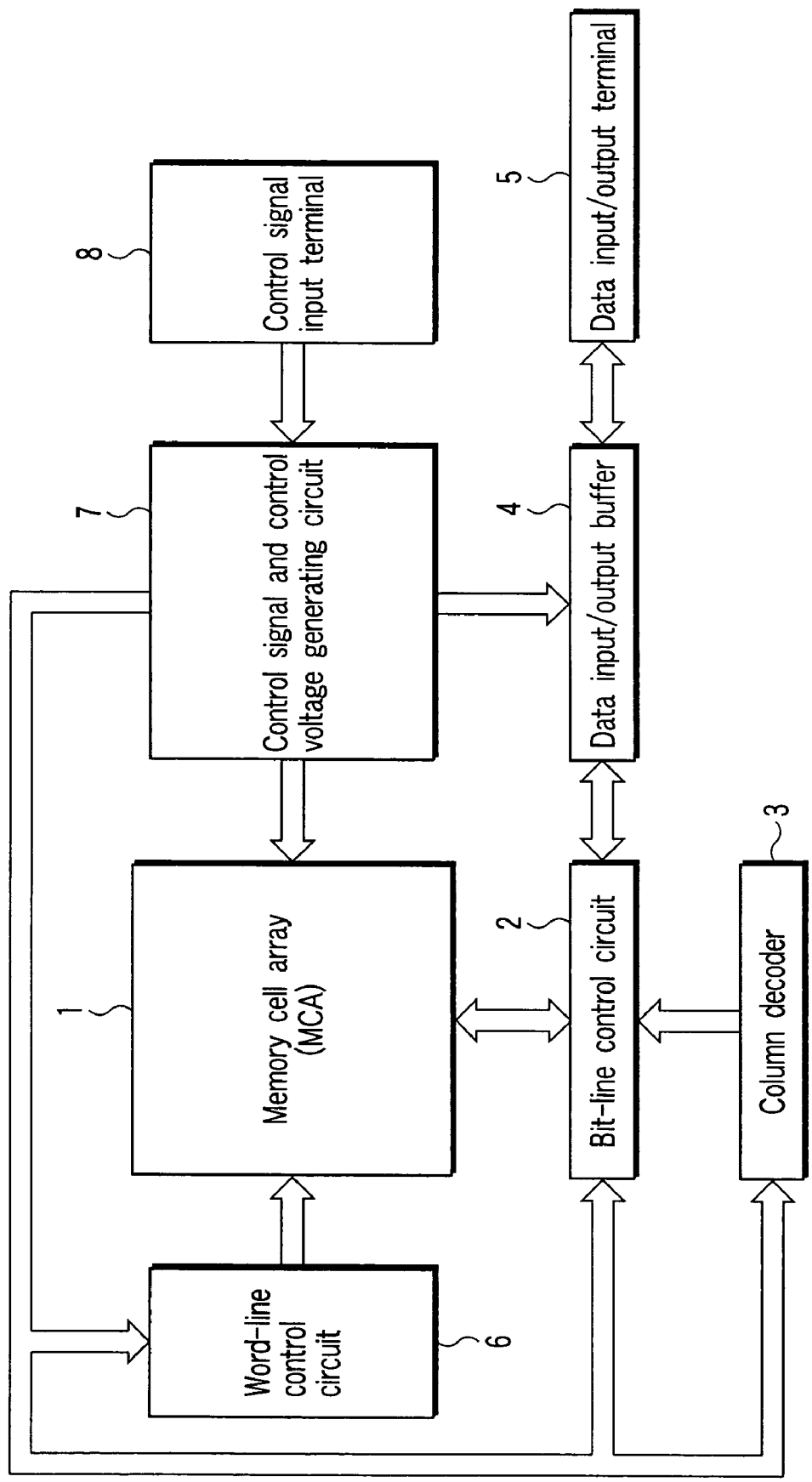
FIG. 2 shows the configuration of the semiconductor memory device according to the first embodiment.

FIG. 2 shows the configuration of a semiconductor memory device according to a first embodiment of the present invention, more specifically, the configuration of, for example, a NAND flash memory which stores 4-valued (2-bit) data.

A memory cell array 1 includes a plurality of bit lines, a plurality of word lines, and a common source line. In the memory cell array 1, memory cells each of which is composed of, for example, an EEPROM cell and enables data to be rewritten electrically are arranged in a matrix. A bit control circuit 2 for controlling the bit lines and a word-line control circuit 6 are connected to the memory cell array 1.

The bit-line control circuit 2 reads data in a memory cell in the memory cell array via a bit line, detects the state of a memory cell in the memory cell array 1 via a bit line, or writes data into a memory cell by applying a write control voltage to the memory cell in the memory cell array 1 via a bit line. A column decoder 3 and a data input/output buffer 4 are connected to the bit-line control circuit 2. A data storage circuit in the bit-line control circuit 2 is selected by the column decoder 3. The data in a memory cell read into the data storage circuit is output via the data input/output buffer 4 from a data input/output terminal 5 to the outside world.

Write data input from the outside world to the data input/output terminal 5 is input via the data input/output buffer 4 to the data storage circuit selected by the column decoder 3.

The word-line control circuit 6 is connected to the memory cell array 1. The word-line control circuit 6 selects a word line in the memory cell array 1 and applies a voltage necessary to read, write, or erase data to the selected word line.

The memory cell array 1, bit-line control circuit 2, column decoder 3, data input/output buffer 4, and word-line control circuit 6 are connected to a control signal and control voltage generating circuit 7 and are controlled by the control voltage generating circuit 7. The control signal and control voltage generating circuit 7 is connected to a control signal input terminal 8 and is controlled by a control signal input from the outside world via the control signal input terminal 8.

The bit-line control circuit 2, column decoder 3, word-line control circuit 6, and control signal and control voltage generating circuit 7 constitute a write circuit and a read circuit.

Figure 3:
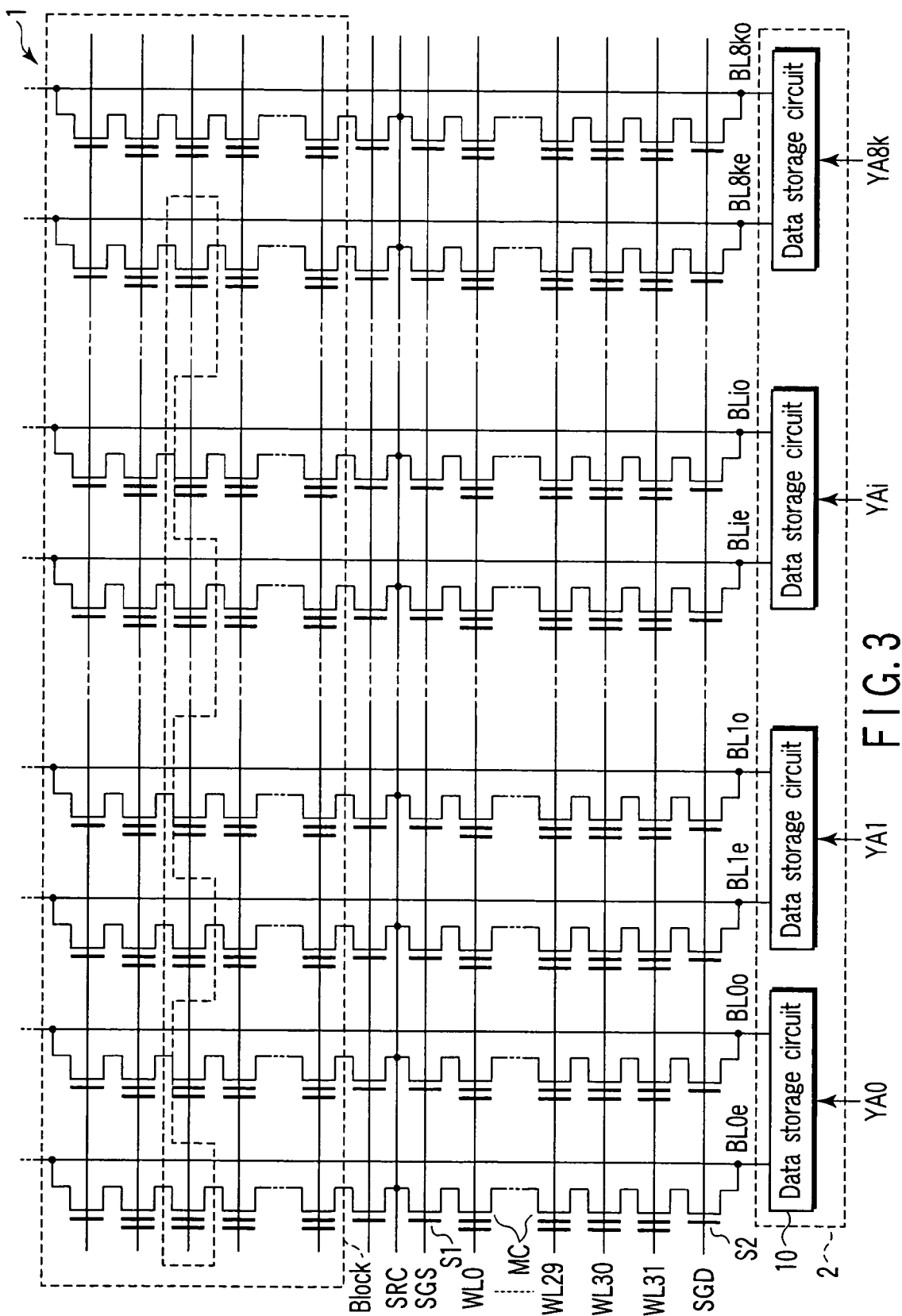
FIG. 3 is a circuit diagram showing the configuration of the memory cell array 1 and bit-line control circuit 2 shown in FIG. 2.

FIG. 3 shows the configuration of the memory cell array 1 and bit-line control circuit 2 shown in FIG. 2. In the memory cell array 1, a plurality of NAND cells are provided. A NAND cell is composed of a memory cell MC made up of, for example, 32 EEPROMs connected in series and select gates S1, S2. Select gate S2 is connected to bit line BL0e and select gate S1 is connected to source line SRC. The control gates of the memory cells MC provided in the individual rows are connected equally to word lines WL0 to WL29, WL30, WL31, respectively. Select gates S2 are connected equally to a select line SGD and select gates S1 are connected equally to a select line SGS.

The bit-line control circuit 2 has a plurality of data storage circuits 10. Pairs of bit lines (BL0e, BL0o), (BL1e, BL1o), ..., (BLie, BLio), (BL8ke, BL8ko) are connected to the individual data storage circuits 10, respectively.

The memory cell array 1 includes a plurality of blocks as shown by broken lines. Each block is composed of a plurality of NAND cells. For example, data is erased in blocks. An erase operation is carried out simultaneously on two bit lines connected to the data storage circuit 10.

A plurality of memory cells (the memory cells in the area enclosed by a broken line) which are provided for every other bit line and are connected to a word line constitute one sector. Data is written and read in sectors.

In a read operation, a program verify operation, and a program operation, one of the two bit lines (BLie, BLio) connected to the data storage circuit 10 is selected according to an address signal (YA0, YA1, ..., YAi, ..., YA8k) supplied from the outside world. In addition, a word line is selected according to an external address.

Figure 4A:
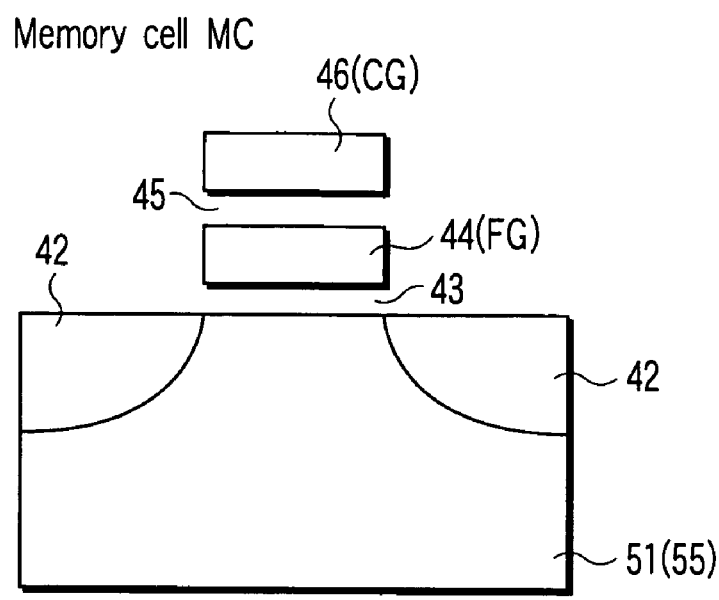
FIGS. 4A and 4B are sectional views of a memory cell and a select transistor.
Figure 4B:
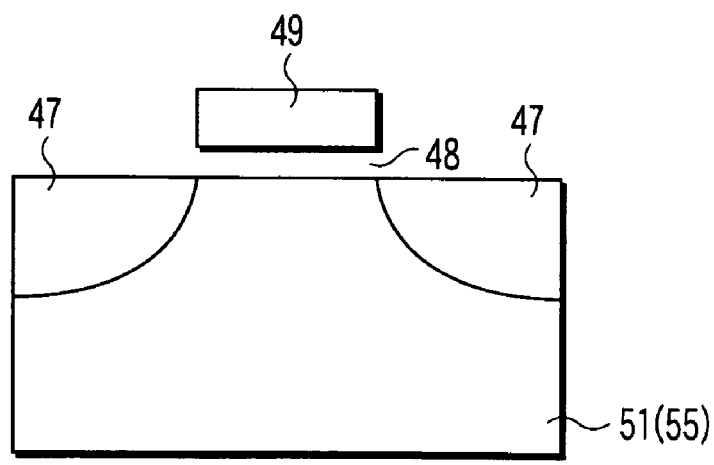

FIGS. 4A and 4B are sectional views of a memory cell and a select transistor. FIG. 4A shows a memory cell. In a substrate 51 (a p-well region 55 explained later), n-type diffused layers 42 serving as the source and drain of a memory cell are formed. On the p-well region 55, a floating gate (FG) 44 is formed via a gate insulating film 43. On the floating gate 44, a control gate (CG) 46 is formed via an insulating film 45. FIG. 4B shows a select gate. In the p-well region 55, n-type diffused layers 47 acting as the source and drain are formed. On the p-well region 55, a control gate 49 is formed via a gate insulating film 48.

Figure 5:
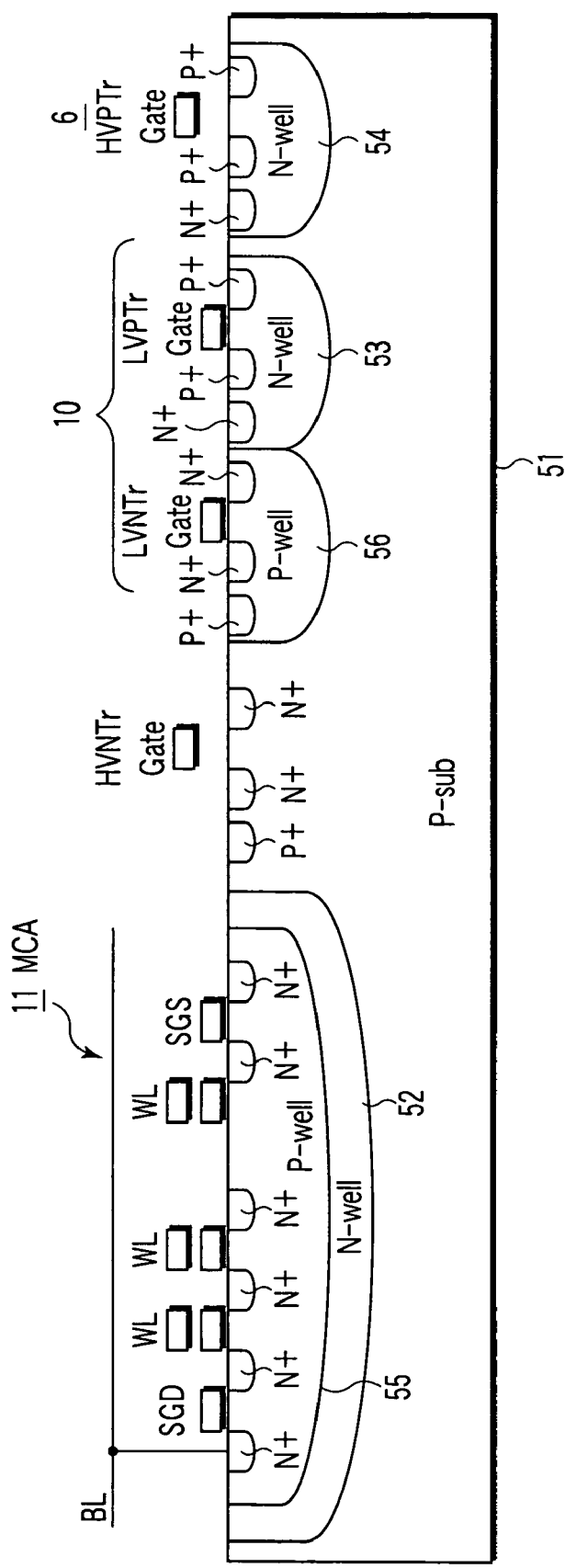
FIG. 5 is a sectional view showing the main part of the semiconductor memory device according to the first embodiment.

FIG. 5 is a sectional view of a semiconductor memory device corresponding to the first embodiment. For example, in the p-type semiconductor substrate 51, n-well regions 52, 53, 54, and p-well regions 55, 56 are formed. In the n-well region 52, a p-well region 55 is formed. In the p-well region 55, a low-voltage n-channel transistor LVNTr constituting the memory cell array 1 is formed. Moreover, in the n-well region 53 and p-well region 56, a low-voltage p-channel transistor LVPTr and a low-voltage n-channel transistor LVNTr constituting the data storage circuit 10 are formed respectively. In the substrate 51, a high-voltage n-channel transistor HVNTr connecting a bit line to the data storage circuit 10 is formed. In addition, in the n-well region 54, a high-voltage p-channel transistor HVPTr constituting, for example, a word-line driving circuit or the like is formed. As shown in FIG. 5, the high-voltage transistors HVNTr, HVPTr each have a thicker gate insulating film than the low-voltage transistors LVNTr, LVPTr.

FIG. 6 shows voltages supplied to various sections in FIG. 5 in an erase operation, a program operation, a positive read operation of reading a positive threshold voltage, and a negative read operation of reading a negative threshold voltage.

Figure 7:
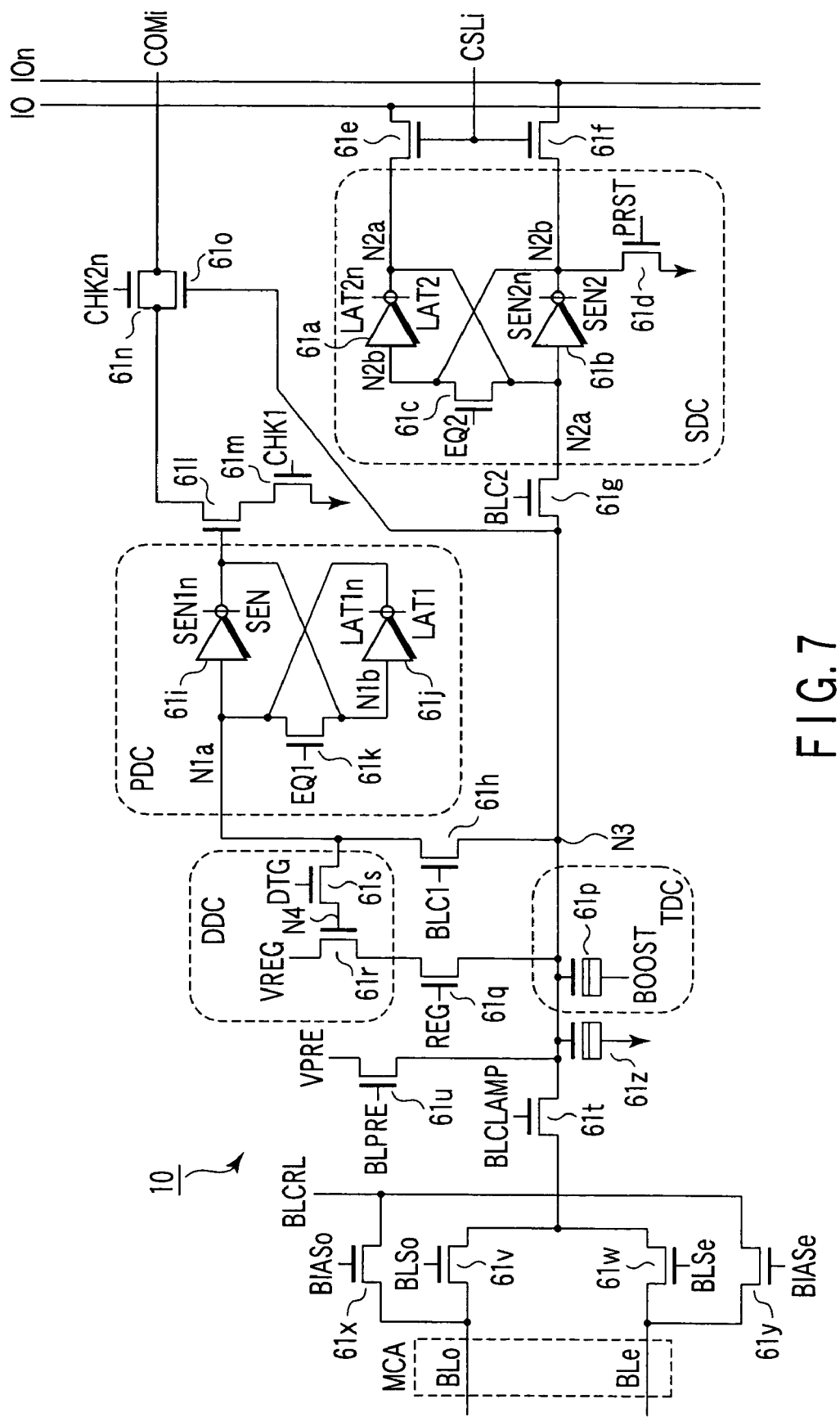
FIG. 7 is a circuit diagram showing an example of the data storage circuit shown in FIG. 3.

FIG. 7 is a circuit diagram of an example of the data storage circuit 10 shown in FIG. 3.

The data storage circuit 10 includes a primary data cache (PDC), a secondary data cache (SDC), a dynamic data cache (DDC), and a temporary data cache (TDC). The SDC, PDC, and DDC hold input data in a write operation, hold readout data in a read operation, holds data temporarily in a verify operation, and is used to manipulate internal data in storing multivalued data. The TDC not only amplifies the data on the bit line in reading data but also is used to manipulate internal data in storing multivalued data The SDC is composed of clocked inverter circuits 61a, 61b constituting a latch circuit and transistors 61c, 61d. The transistor 61c is connected between the input terminal of the clocked inverter circuit 61a and the input terminal of the clocked inverter circuit 61b. A signal EQ2 is supplied to the gate of the transistor 61c. The transistor 61d is connected between the output terminal of the clocked inverter circuit 61b and the ground. A signal PRST is supplied to the gate of the transistor 61d. Node N2a of the SDC is connected via a column select transistor 61e to an input/output data line IO. Node N2b of the SDC is connected via a column select transistor 61f to an input/output data line IOn. A column select signal CSLi is supplied to the gates of the transistors 61e, 61f. Node N2a of the SDC is connected via the transistors 61g, 61h to node N1a of the PDC. A signal BLC2 is supplied to the gate of the transistor 61g. A signal BLC1 is supplied to the gate of the transistor 61h.

The PDC is composed of clocked inverter circuits 61i, 61j and a transistor 61k. The transistor 61k is connected between the input terminal of the clocked inverter circuit 61i and the input terminal of the clocked inverter circuit 61j. A signal EQ1 is supplied to the gate of the transistor 61k. Node N1b of the PDC is connected to the gate of a transistor 61l. One end of the current path of the transistor 61l is connected via a transistor 61m to the ground. A signal CHK1 is supplied to the gate of the transistor 61m. The other end of the current path of the transistor 61l is connected to one end to the current path of transistors 61n, 61o constituting a transfer gate. A signal CHK2n is supplied to the gate of the transistor 61n. The gate of the transistor 61o is connected to node N3. A signal COMi is supplied to the other end of the current path of the transistors 61n, 61o. The signal COMi, which is a signal common to all of the data storage circuits 10, is a signal to indicate whether the verification of all of the data storage circuits 10 has been completed. That is, as described later, when the verification has been completed, node N1b of the PDC will go low. In this state, when the signals CHK1 and CHK2n are made high, if the verification has been completed, the signal COMi will go high.

Moreover, the TDC is composed of, for example, a MOS capacitor 61p. One end of the capacitor 61p is connected to the junction node N3 of the transistors 61g, 61h. A signal BOOST explained later is supplied to the other end of the capacitor 61p. Also connected to the junction node N3 is the DDC via a transistor 61q. A signal REG is supplied to the gate of the transistor 61q.

The DDC is composed of transistors 61r, 61s. A signal VREG is supplied to one end of the current path of the transistor 61r. The other end of the current path of the transistor 61r is connected to the current path of the transistor 61q. The gate of the transistor 61r is connected via the transistor 61s to node N1a of the PDC. A signal DTG is supplied to the gate of the transistor 61s.

Furthermore, one end of the current path of each of transistors 61t, 61u is connected to the junction node N3. A signal VPRE is supplied to the other end of the current path of the transistor 61u. BLPRE is supplied to the gate of the transistor 61u. A signal BLCLAMP is supplied to the gate of the transistor 61t. The other end of the current path of the transistor 61t is connected via a transistor 61v to one end of bit line BLo and via a transistor 61w to one end of bit line BLe. One end of bit line BLo is connected to one end of the current path of a transistor 61x. A signal B1ASo is supplied to the gate of the transistor 61x. One end of bit line BLe is connected to one end of the current path of a transistor 61y. A signal B1ASe is supplied to the gate of the transistor 61y. A signal BLCRL is supplied to the other ends of the transistors 61x, 61y. The transistors 61x, 61y are turned on according to the signals B1ASo, B1ASe in such a manner that they are complementary to the transistors 61v, 61w, thereby supplying the potential of the signal BLCRL to the unselected bit lines.

Between node N3 and the ground, for example, a MOS capacitor 61z is connected. The capacitor 61z regulates the potential at node N3 so that the potential at node N3 may not rise too much by coupling when the capacitor 61p of the TDC explained later is raised by a signal BOOST. From this point on, let the data in the PDC be the potential at node N1a, the data in the SDC be the potential at node N2a, the data in the TDC be the potential at node N3, and the data in the DDC be the potential at node N4.

The above signals and voltages are generated by the control signal and control voltage generating circuit 7 of FIG. 2. On the basis of control performed by the control signal and control voltage generating circuit 7, the operations below are controlled.

Since the memory is a multivalued memory, 2-bit data can be stored in a single cell. The switching between the two bits is done by addresses (a first page and a second page).

Figure 8C:
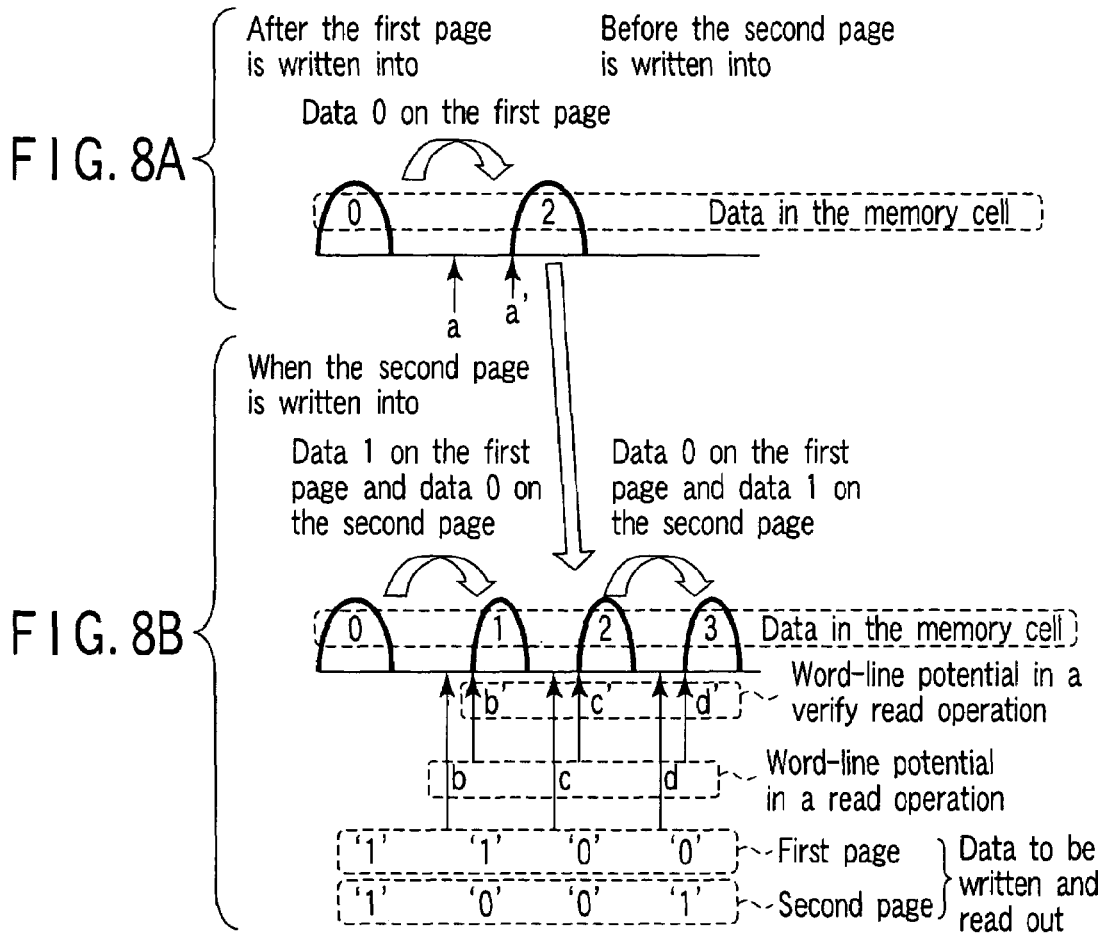
Figure 8C:
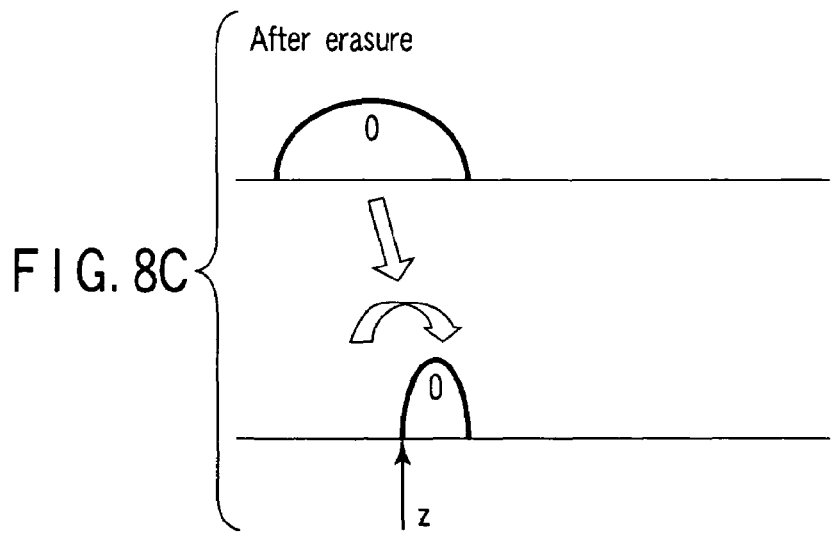

FIGS. 8A, 8B, and 8C show the relationship between the data in a memory cell and the threshold voltages of the memory cell. When an erase operation is carried out, the data in the memory cell becomes "0" as shown in FIGS. 8A and 8C. After the first page is written into, the data in the memory cell becomes either data "0" or data "1". Here, data "0" has a negative threshold voltage and data "1" has a positive threshold voltage.

In addition, as shown in FIG. 8B, after the second page is written into, the data in the memory cell becomes data "0", "1", "2", and "3". In the first embodiment, the data in the memory cell are defined in ascending order of threshold voltage.

Figure 9:
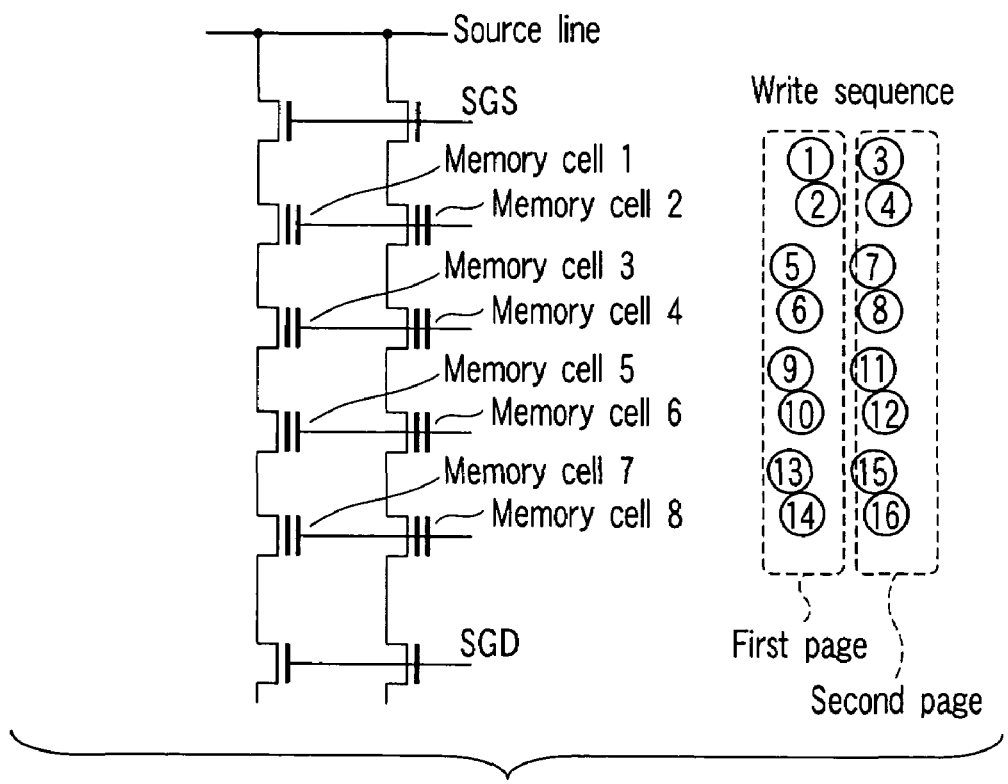
FIG. 9 shows an example of write sequence in the first embodiment.

FIG. 9 shows an example of write sequence in the first embodiment. In a block, a write operation is carried out in pages, starting with the memory cell closest to the source line.

(Read Operation)

As shown in FIG. 8A, after the first page is written into, the data in the memory cell is either "0" or "2". Therefore, the potential of a word line is set to a midpoint potential "a" of the threshold voltages of these data to execute a read operation, which enables the data to be read out. Furthermore, after the second page is written into, the data in the memory cell is any one of "0", "1", "2", and "3". Therefore, setting the potential of the word line at "b", "c", and "d" enables these data to be read out. Here, for example, the potentials "a" and "b" are at negative levels and the potentials "c" and "d" are at positive levels.

(Positive Level Read)

First, a read operation using the positive levels "c" and "d" will be explained.

Figure 17:
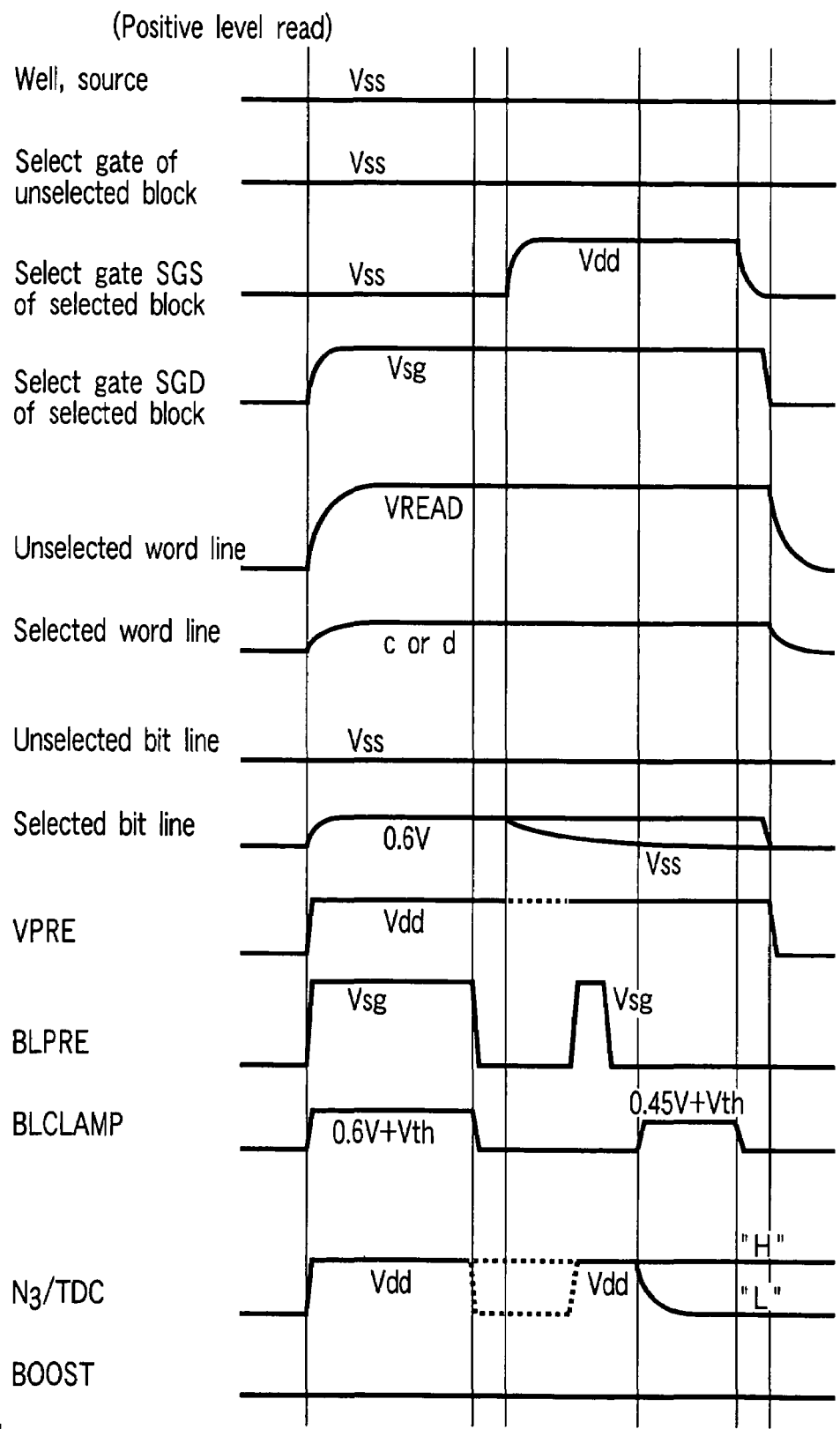
FIG. 17 is a timing chart showing an operation of a positive level read according to the first embodiment.

As shown in FIGS. 6 and 17, when the output voltage of a constant voltage generating circuit 71 of FIG. 1 is made Vss (0 V: the ground voltage), Vss (0 V) is supplied to the well of the selected cell, the source line, the unselected bit lines, and the select gates of the unselected blocks, a read potential "c" or "d" is supplied to the selected word line, Vread is supplied to the unselected word lines of the selected block, and Vsg (Vdd+Vth) is supplied to the select gate SGD of the selected block. Vdd is, for example, 2.5 V and Vth is the threshold voltage of an n-channel MOS transistor.

Next, a voltage of Vdd (e.g., 2.5 V), a voltage of Vsg (Vdd+Vth), and a voltage of, for example, (0.6 V+Vth) are temporarily supplied to signal VPRE, signal BLPRE, and signal BLCLAMP of the data storage circuit 10 shown in FIG. 7, respectively, thereby precharging the bit lines at, for example, 0.6 V. Next, the select line SGS on the source side of the cell is put at Vsg (Vdd+Vth). If the threshold voltage of the cell is higher than "c" or "d", the cell will be turned off. Therefore, the bit lines remain high. If the threshold voltage of the cell is lower than "c" or "d", the cell will be turned on. Therefore, the bit lines are discharged via these cells and go low. Here, signal BLPRE of the data storage circuit 10 of FIG. 7 is temporarily made Vsg(Vdd+Vth) and VPRE is temporarily made Vdd (VPRE=Vdd), thereby precharging the node of the TDC at Vdd. Thereafter, signal BLCLAMP is set at, for example, (0.45 V+Vth). At node N3 of the TDC, a potential of the bit line is at a low level lower than 0.45 V or at a high level higher than 0.45 V. Then, after signal BLCLAMP is set at Vss (BLCLAMP=Vss), BLC1 is set at Vsg(Vdd+Vth) (BLC1=Vsg(Vdd+Vth), thereby reading the potential of the TDC into the PDC. If the threshold voltage of the cell is lower than the potential of the word line "c" or "d", the PDC goes low. If the threshold voltage of the cell is higher than the potential of the word line "c" or "d", the PDC goes high, which enables reading to be done.

(Negative Level Read)

Next, the operation of reading negative levels "a" and "b" will be explained.

In this case, negative levels "a" and "b" are supplied to the selected word line. When negative levels are output, however, the potential setting of the row decoder is complicated as described above.

Figure 10:
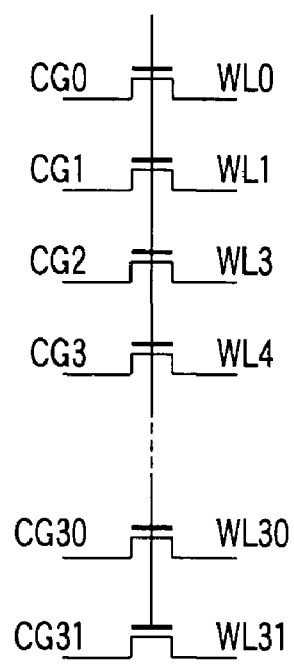
FIG. 10 shows a case where a high withstand voltage NMOS transistor constituting a row decoder is formed on a p-type substrate.

That is, as shown in FIG. 10, when a high withstand voltage NMOS transistor HVNTr constituting a row decoder is formed on a p-type substrate, setting the control gate CG of the transistor HVNTr to a negative potential brings its drain to a negative potential. For this reason, the high withstand voltage NMOS transistor HVNTr has to be formed on a p-well. This raises a problem: the manufacturing process becomes complicated.

In the first embodiment, to overcome this problem, a constant voltage generating circuit 71 which generates a voltage Vfix (e.g., 1.6 V) is provided as shown in FIG. 1. In negative-level reading, the constant voltage generating circuit 71 supplies a voltage Vfix (e.g., 1.6 V) to the well of the cell selected by the constant voltage generating circuit 71, the source line, the unselected bit lines, and the select gates of the unselected blocks.

Specifically, as shown in FIG. 1, a transistor 72 is connected between the source line SRC and the constant voltage generating circuit 71. A transistor 73 is connected to the p-well region 55 where memory cells and select gates are formed. One end of a transistor 74 is connected to the source line SRC. One end of the transistor 75 is connected to the p-well region 55 where memory cells and select gates are formed. To the other ends of these transistors 74, 75, an erase voltage Vera is supplied in an erase operation. The transistors 72, 73 are turned off according to signal/Sera in an erase operation and are turned on in a read operation. In addition, the transistors 74, 75 are turned on according to signal Sera in an erase operation and are turned off in a read operation. The constant voltage generating circuit 71 is provided in the control signal and control voltage generating circuit 7 of FIG. 2.

Figure 18:
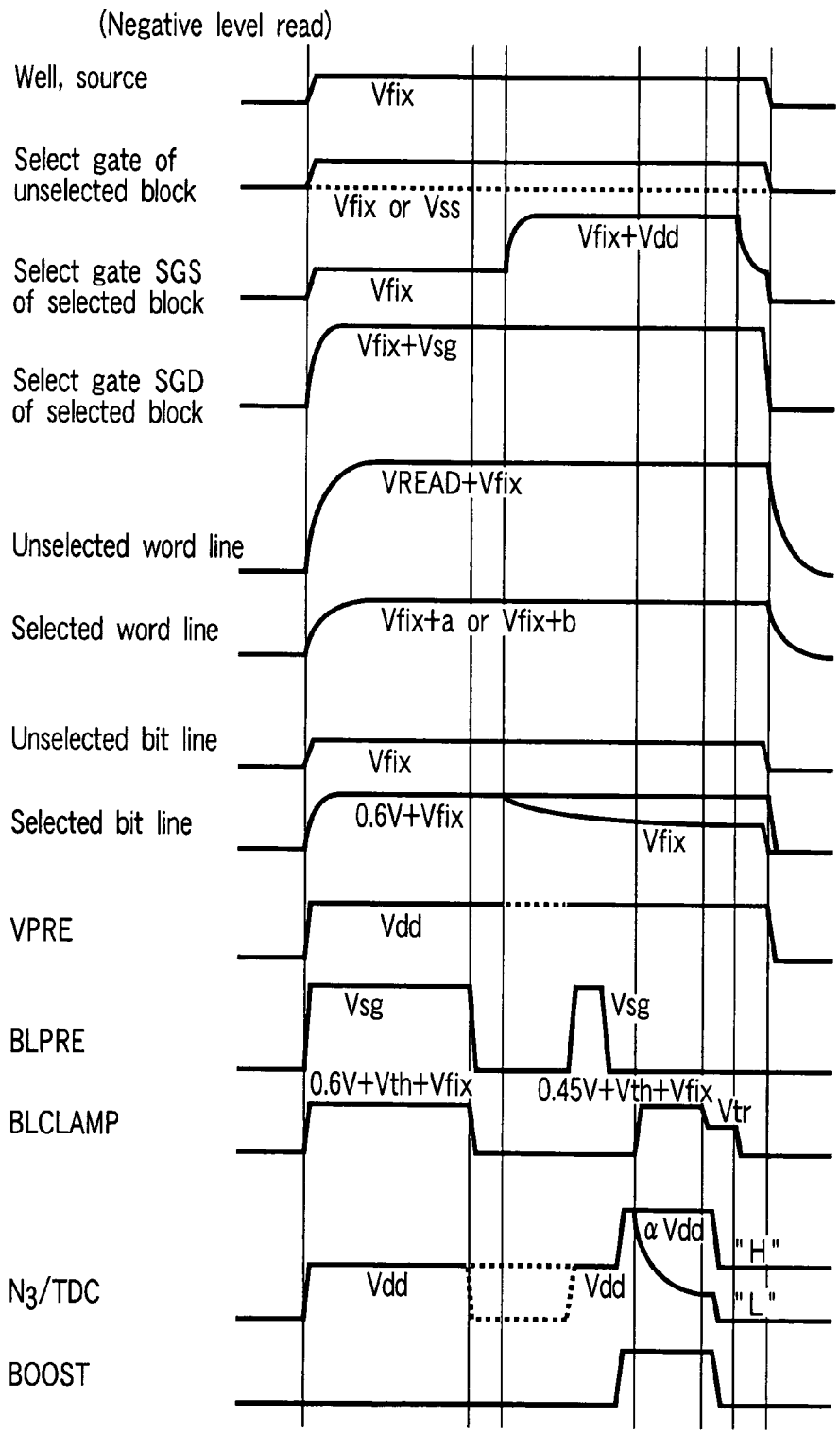
FIG. 18 is a timing chart showing an operation of a negative level read according to the first embodiment.

In the above configuration, with reference to FIG.18, an explanation will be given as to a case where, for example, the transistors 61$v$, 61$y$ are turned on, the transistors 61$w$, 71$y$ are turned off, and the negative level data is read from the memory cell connected to bit line BLo. At this time, the transistors 72, 73 are on and the transistors 74, 75 are off. Therefore, the constant voltage generating circuit 71 supplies a voltage Vfix (e.g., 1.6 V) to the well of the selected cell, the source line SRC, the unselected bit lines. The constant voltage generating circuit 71 supplies a voltage Vfix (e.g., 1.6 V) or Vss to the select gates of the unselected blocks, the select gates of the unselected blocks are turned off.

Furthermore, when a read potential Vfix+a (e.g., if a=−0.5 V, Vfix+a is 1.1 V) or Vfix+b (e.g., if b=−1 V, Vfix+b is 0.6 V) is supplied to the selected word line, the negative potential is seemingly supplied to the gate of the cell. At the same time, Vread+Vfix is supplied to the unselected word lines of the selected block, Vsg(Vdd+Vth)+Vfix is supplied to the select gate SGD of the selected block, and Vfix is supplied to the SGS.

Next, in the data storage circuit 10 of FIG. 7, a voltage of Vdd (e.g., 2.5 V), a voltage of Vsg(Vdd+Vth), and a voltage of, for example, (0.6 V+Vth)+Vfix are supplied to signal VPRE, signal BLPRE, and signal BLCLAMP, respectively, thereby precharging the bit lines at, for example, 0.6 V+Vfix=2.2 V.

Next, the select line SGS on the source side of the cell is put at Vsg(Vdd+Vth)+Vfix. Since the potential of the well and that of the source are at Vfix, if the threshold voltage is higher than "a" (e.g., a=−0.5 V) or "b" (e.g., b=−1 V), the cell is turned off. For this reason, the bit lines remain high (e.g., 2.2 V). If the threshold voltage is lower than "a" or "b", the cell turn on. Therefore, the bit line BLo is discharged and goes to the same potential Vfix (e.g., 1.6 V) as that of the source line SRC. That is, the potential of the bit line BLo is discharged via the cell in the on state and the charge on the bit line BLo moves to the bit line BLe via the NAND cell, source line SRC, and transistors 72, 61$y$.

As shown in FIG. 3, the number of bit lines in the memory cell array 1 is, for example, 16$k$. Accordingly, when the charge Q discharged from the bit line flows into the constant voltage generating circuit 71, the operation of the constant voltage generating circuit 71 becomes unstable.

However, in the first embodiment, as shown in FIG. 1, the charge precharged on the bit line is accumulated in the capacitance C between the selected bit line (BLo) and the unselected bit line (BLe). The source line SRC is connected to the unelected bit line BLe. Therefore, the charge +Q on the selected bit line BLo is offset with the charge −Q on the unselected bit line BLe, which prevents a large current from flowing into the constant voltage generating circuit 71. Thus, the operation of the constant voltage generating circuit 71 can be maintained stably.

In the above state, the signal BLPRE of the data storage circuit 10 of FIG. 7 is put at a voltage of Vsg(Vdd+Vth) and the signal VPRE is put at a voltage of Vdd, thereby precharging node N3 of the TDC at Vdd. Thereafter, the signal BOOST is changed from the low level to the high level, giving TDC=αVdd (e.g., α=1.7 and αVdd=4.25 V). Here, the signal BLCLAMP is set at, for example, a voltage of (0.45 V+Vth)+Vfix. Then, if the potential of the bit line is lower than 0.45 V+Vifx, node N3 of the TDC goes to the low level (Vfix (e.g., 1.6 V)). If the potential of the bit line is higher than 0.45 V, node N3 of the TDC remains at the high level (αVdd (e.g. 4.25 V)). Thereafter, after the signal BLCLAMP is set at Vtr (BLCLAMP=Vtr (e.g., 0.1 V+Vth), the signal BOOST is changed from the high level to the low level. Here, when the TDC is at the low level, it drops from Vfix (e.g., 1.6 V). However, since signal BLCLAMP=Vtr (e.g., 0.1 V+Vth), it does not drop below 0.1 V. Furthermore, when the TDC is at the high level, it changes from (αVdd (e.g., 4.25 V)) to Vdd. Here, the signal BLC1 is set at Vsg(Vdd+Vth) (BLC1=Vsg(Vdd+Vth)) and the potential of the TDC is read into the PDC. Therefore, if the threshold voltage of the cell is lower than the voltage "a" or "b", the PDC goes to the low level. If the threshold voltage of the cell is higher than the voltage "a" or "b", the PDC goes to the high level, which enables reading. In this way, it is possible to read the negative threshold voltage set in the cell without setting the word line at the negative voltage.

(Program and Program Verify)

Next, a program operation of setting the threshold voltages shown in FIG. 8B will be explained. In a program operation, an address is specified first, thereby selecting a second page shown in FIG. 3.

As shown in FIG. 8A, after a first page is written into, the data in a memory cell become data "0" and data "2". That is, if the write data is "1" (no writing is done), the data in the memory cell remains data "0". If the write data is "0" (writing is done), the data in the memory cell is data "2".

After the second page is written into, the data in the memory cell becomes data "0", "1", "2", and "3". That is, if the write data on the first page is "1" and the write data on the second page is "1", the data in the memory cell remains "0". If the write data on the second page is "0", the data in the memory cell is "1". Moreover, if the write data on the first page is "0" and the write data on the second page is "0", the data in the memory cell remains "2". If the write data on the second page is "1", the data in the memory cell is "3".

Figure 12:
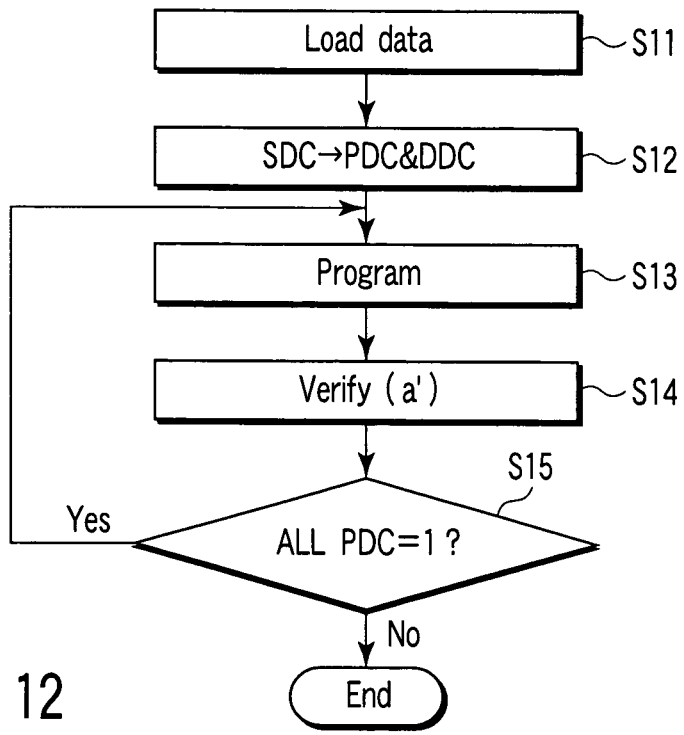
FIG. 12 is a flowchart to help explain a 4-valued data write sequence and a first page write operation.
Figure 13:
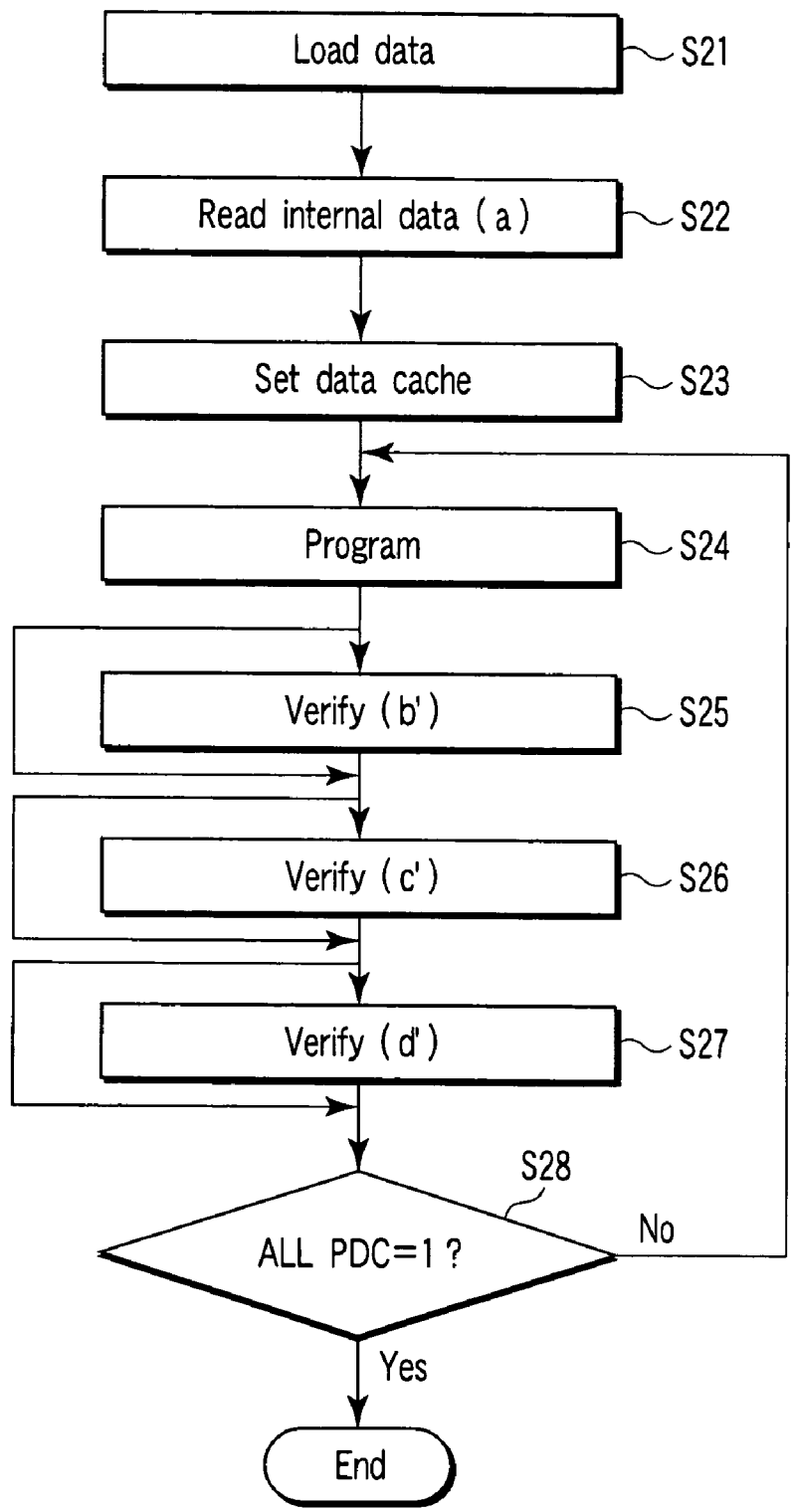
FIG. 13 is a flowchart to help explain a 4-valued data write sequence and a second page write operation.

FIG. 12 shows a program and a verify operation of the first page. FIG. 13 shows a program and a verify operation of the second page.

(First Page Program)

First, according to an address, the first page is selected.

Next, as shown in FIG. 12, data to be written is externally input and is stored in the SDCs of all the data storage circuits 10 (S11). Thereafter, when a write command is input, the data in the SDCs of all the data storage circuits 10 are transferred to the PDCs (S12). If data "1" (no writing is done) is externally input, N1a of the PDC goes to the high level. If data "0" (writing is done) is externally input, N1a of the PDC goes to the low level.

(Program Operation) (S13)

When a voltage of Vdd+Vth is supplied to the signal BLC1 shown in FIG. 7, if data "1" is stored in the PDC, the potential of the bit line will be Vdd. If data "0" is stored in the PDC, the potential of the bit line will be Vss. The cells which are connected to the selected word line and are on the unselected page (with the bit line being unselected) must not be written into. For this reason, the potentials of the bit lines connected to these cells are also set to Vdd as are those of the bit lines corresponding to data "1". Here, when Vdd is supplied to the select line SGS of the selected block, Vpgm (20 V) is supplied to the selected word line, and Vpass (10 V) is supplied to the unselected word lines, if the potential of the bit line is Vss, the channel of the cell is at Vss and the word line is at Vpgm, which enables writing.

On the other hand, when the potential of the bit line is at Vdd, the channel of the cell rises to a high potential through coupling by raising Vpgm and Vpass, not Vss, which prevents a program operation.

A program verify operation is carried out at "a'" level a little higher than "a" level in a read operation (hereinafter, "'" means a verify potential and is determined to be a potential a little higher than a read potential). A program and a verify operation are repeated until the threshold voltage of the memory cell has reached "a'" level (S14, S15, S13). A verify operation will be described later.

(Second Page Program)

As shown in FIG. 13, first, data to be written into is externally input and is stored into the SDCs of all the data storage circuits 10 (S21).

(Internal Data Read) (S22)

First, before the cells are written into, an internal read operation is carried out so as to determine whether the data in the memory cells on the first page is "0" or "2". The internal read operation is the same as the above-described negative level read operation. In the internal read operation, "a" level is supplied to the word line, thereby carrying out a read operation.

(Setting Data Cache) (S23)

Thereafter, the data stored in each data cache is manipulated. Specifically, the data in the SDC is transferred to the PDC. The data in the PDC is transferred to the DDC. Next, the data in the DDC is inverted and transferred to the SDC. Thereafter, the data in the PDC is transferred to the DDC. Then, the data in the DDC is inverted and transferred to the PDC. Thereafter, the data in the PDC is transferred to the DDC. In such an operation, to set the data in the memory cells at "0" (data "1" on the first page and data "1" on the second page), all of the PDC, DDC, and SDC are set at the high level.

When the data in the memory cell is set at "1" (data "1" on the first page and data "0" on the second page), the PDC is set at the low level, the DDC is set at the low level, and the SDC is set at the high level.

When the data in the memory cell is set at "2" (data "0" on the first page and data "0" on the second page), the PDC is set at the low level, the DDC is set at the high level, and the SDC is set at the low level.

When the data in the memory cell is set at "3" (data "0" on the first page and data "1" on the second page), all of the PDC, DDC, and SDC are set at the low level.

As described above, in the state where each data cache is set, the program on the second page is executed as that on the first page (S24).

Thereafter, using the respective levels "b'", "c'", and "d'", a program verify operation is carried out (S25 to S28 and S24).

Next, program verify operations on the first and second pages will be explained.

(Negative Level Program Verify Read)

In the above-described program, data is written, staring at the lowest threshold voltage level. For this reason, on the first page, a program verify operation is carried out at "a'" level. On the second page, a program verify operation is performed at "b'" level. A program verify operation is almost the same as a read operation.

First, the constant voltage generating circuit 71 supplies a voltage Vifx (e.g., 1.6 V) to the well of the selected cell, the source line, the unselected bit lines, and the select gates of the unselected blocks. A voltage Vfix+a' (e.g., if a'=−0.4 V, Vfix+a' is 1.2 V) or Vfix+b' (e.g., if b'=−0.8 V, Vfix+b' is 0.8 V) a little higher than a read potential Vfix+a or Vfix+b is supplied to the selected word line, thereby seemingly supplying a negative potential to the gate of the cell. At the same time, Vread+Vfix is supplied to the unselected word lines of the selected block, Vsg(Vdd+Vth)+Vfix is supplied to the select line SGD of the selected block, and Vfix is supplied to the SGS.

Next, in the data storage circuit 10, a voltage of Vdd (e.g., 2.5 V) is supplied to the signal VPRE, a voltage of Vsg (Vdd+Vth) is supplied to the signal BLPRE, and a voltage of, for example, (0.6 V+Vth)+Vfix is supplied to the signal BLCLAMP, thereby precharging the bit line to, for example, 0.6 V+Vfix=2.2 V. Next, the select line SGS on the source side of the cell is set at Vsg(Vdd+Vth)+Vfix. Since the voltages of the well and source are at Vifx, if the threshold voltage of the cell is higher than the verify voltage "a" (e.g., a'=−0.4 V) or "b" (e.g., b'=−0.8 V), the cell turns off. Therefore, the bit line remains high (e.g., at 2.2 V). If the threshold voltage of the cell is lower than the verify voltage "a'" or "b'", the cell turns on. Accordingly, the bit line is discharged and becomes the same potential as that of the source, that is, Vfix (e.g., 1.6 V). While the bit line is being discharged, VPRE and BLPRE are temporarily set at Vss and Vdd, respectively, (VPRE=Vss and BLPRE=Vdd) and the TDC is made low (TDC=low level). Thereafter, VREG is set at Vdd (VREG=Vdd) and REG is made high (REG=high level), thereby copying the DDC into the TDC. Next, the DTG is temporarily set at Vsg(Vdd+Vth) (DTG=Vsg(Vdd+Vth), thereby copying the data in the PDC into the DDC. Finally, BLC1 is made high, thereby copying the data in the TDC into the PDC.

Next, the signal BLPRE of the data storage circuit 10 is set at Vsg(Vdd+Vth), thereby precharging node N3 of the TDC at Vdd. Thereafter, the signal BOOST is changed from the low level to the high level, giving TDC=αVdd (e.g., a=1.7 and αVdd=4.25 V). Here, the signal BLCLAMP is set at, for example, (0.45 V+Vth)+Vfix. If the potential of the bit line is lower than 0.45 V+Vfix, node N3 of the TDC is at the low level (Vfix (e.g., 1.6 V)). If the potential of the bit line is higher than 0.45 V, node N3 of the TDC remains at the high level (αVdd (e.g., 4.25 V)). After the signal BLCLAMP is set at Vtr (e.g., 0.1 V+Vth) (BLCLAMP=Vtr), the signal BOOST is changed from the high level to the low level.

Here, if the signal BOOST is at the low level, the potential of the TDC drops from Vfix (e.g., 1.6 V). However, since the signal BLCLAMP=Vtr (e.g., 0.1 V+Vth), the potential of the TDC does not drop below 0.1 V. In addition, if the signal BOOST is at the high level, the potential of the TDC changes from αVdd (e.g., 4.25 V) to Vdd. Here, when the signal VREG is set at Vdd (VREG=Vdd) and the signal REG is set at Vsg (Vdd+Vth) (REG=Vsg(Vdd+Vth)), if the DDC is at the high level (unwritten), the TDC is forced to be at the high level. However, if the DDC is at the low level (unwritten), the data in the TDC remain unchanged. Next, DTG is made equal to VSG (DTG=VSG) temporarily, thereby copying the data in the PDC into the DDC. Then, the signal BLC1 is set at Vsg(Vdd+Vth) (BLC1=Vsg(Vdd+Vth)), thereby reading the potential of the TDC into the PDC. Therefore, if the PDC is at the low level (PDC=low level) (written) from the beginning and the threshold voltage of the cell is lower than "a'" or "b'", the PDC goes to the low level again (written). If the threshold voltage of the cell is higher than "a'" or "b'", the PDC goes to the high level and is not written into in the next program loop. If PDC=high level (unwritten) from the beginning, the PDC is at the high level (PDC=high level), resulting in no writing in the next program loop.

Furthermore, when the second page is written into, if the above operation is carried out in a program verify operation at "b'" level, the cells written into at "c'" and "d'" levels become unwritten in the program verify operation at "b'" level. However, when writing is done at "c'" and "d'" levels, node N2a of the SDC is set at the low level. When writing is done at "b'" level, node N2a of the SDC is set at the high level. Therefore, when the signal BLC2 is set at Vtr(0.1 V+Vth) (BLC2=Vtr(0.1 V+Vth) before the unwritten TDC is forced to be at the high level, if writing is done at "c'" level or "d'" level, the TDC will be forced to be at the low level, thereby preventing writing from being completed in the program verify operation at "b'" level.

(Positive Program Verify)

When the second page is written into, a program operation and a verify operation at "b'" level are repeated. After a period of time, writing at "c" level is also completed. Therefore, a program operation and verify operations at "b'" level and at "c'" level are repeated. Then, a program operation and verify operations at "b'" level, at "c'" level, and at "d'" level are repeated. After another period of time, writing at "b'" level is completed. Thus, a program and verify operations at "c'" level and at "d'" level are repeated. Finally, a program and a verify operation at "d'" level are repeated.

First, the operation of reading at "c" level and at "d" level, positive levels, will be explained.

Vss is supplied to the well of the selected cell, the source line, the unselected bit lines, and the select gates of the unselected blocks. A read potential "c'" or "d'" is supplied to the selected word line. Vread is supplied to the unselected word lines of the selected block. Vsg(Vdd+Vth) is supplied to the select gate SGD of the selected block. Next, in the data storage circuit 10, the signal VPRE is set at Vdd (e.g., 2.5 V), the signal BLPRE is set at Vsg(Vdd+Vth), and the signal BLCLAMP is set at, for example, (0.6 V+Vth), thereby precharging the bit line to, for example, 0.6 V.

Next, the select line SGS on the source side of the cell is set at Vsg(Vdd+Vth). If the threshold voltage is higher than "c'" or "d'", the cell turns off. As a result, the bit line remains at the high level. If the threshold voltage is lower than "c'" or "d'", the cell turns on, bringing the bit line into the low level. While the bit line is being discharged, VPRE and BLPRE are temporarily set at Vss and Vdd, respectively (VPRE=Vss and BLPRE=Vdd) and the TDC is made low (TDC=low level). Then, the VREG is set at Vdd (VREG=Vdd) and the REG is made high (REG=high level), thereby copying the DDC into the TDC. Next, the DTG is temporarily set at Vsg (Vdd+Vth), thereby copying the PDC into the DDC. Finally, BLC1 is made high (BLC1=high level), thereby copying the TDC into the PDC. Thereafter, the signal BLPRE is set at Vsg(Vdd+Vth), thereby precharging node N3 of the TDC at Vdd. Then, the signal BLCLAMP is set at, for example (0.45 V+Vth). If the bit line is lower than 0.45 V, node N3 of the TDC goes to the low level. If the bit line is higher than 0.45 V, node N3 goes to the high level. After the signal BLCLAMP is set at Vss (BLCLAMP=Vss), the signal VREG is set at Vdd (VREG=Vdd) and the signal REG is set at Vsg(Vdd+Vth). If the DDC is at the high level (unwritten), the TDC is forced to be at the high level. However, if the DDC is at the low level (unwritten), the value of the TDC remains unchanged. Here, the signal BLC1 is set at Vsg(Vdd+Vth) (BLC1=Vsg (Vdd+Vth)), thereby reading the potential of the TDC into the PDC. Therefore, when the PDC is at the low level from the beginning (written), if the threshold voltage of the cell is lower than "c'" or "d'", the PDC goes to the low level again (written). If the threshold voltage of the cell is higher than "c'" or "d'", the PDC goes to the high level and becomes unwritten in the next program loop. In addition, when the PDC is at the high level from the beginning (unwritten) (PDC=high level), the PDC is at the high level (PDC=high level) and becomes unwritten in the next program loop.

Furthermore, when the second page is written into, if the above operation is carried out in a program verify operation at "c'" level, the cell to be written into at "d'" level will be unwritten in a program verify operation at "c'" level. Thus, VREG is set at Vdd (VREG=Vdd) and the signal REG is set at Vsg (REG=Vsg). Immediately before the operation of forcing the unwritten TDC to be at the high level, if writing is done at "c'" level, node N1a of the PDC will be at the low level. In the other cases, node N1a will be at the low level. Thus, the signal BLC1 is set at Vtr(0.1 V+Vth) (BLC1=Vtr (0.1 V+Vth). When writing is done at "d'", the TDC is forced to be at the low level, preventing writing from being completed in a program verify operation at "d'" level.

If the PDC is at the low level, the write operation will be carried out again. The program operation and verify operation are repeated until the data in all the data storage circuit 10 have become high.

(Erase Operation)

An erase operation is carried out in blocks shown by broken lines in FIG. 3. Erasing is done simultaneously on two bit lines (BLie, BLio) connected to the data storage circuit 10. First, the transistors 74, 75 of FIG. 1 are turned on, the transistors 72, 73 are turned off, the well where the source line SRC and memory cell are formed is set at an erase voltage Vera=20 V, the potential of the word line in the selected block is set at 0 V, and the other word lines are set in a floating state, thereby erasing the data in the memory cell in the selected block. After the erasure, the threshold voltage of the cell becomes data "0" (negative threshold voltage) as shown in FIG. 8C.

In the case of a writing method of self-boosting an erased area, the threshold voltage of an erased cell has to be made shallower. First, the writing method of self-boosting an erased area will be explained.

In this writing method, data is always written from the source side of a NAND cell as shown in FIG. 14. When data is written into the cell, the bit line is set at Vss. When data is not written, the bit line is set at Vdd. Next, for example, when data is written into the selected cell using WL7, WL0 to WL4 are set at Vpass, WL5 is set at Vss, WL6 is set at Vdd, WL7 is set at a program voltage Vpgm, and WL8 to WL31 are set at Vpass. In this state, when data is written, since the gate of word line WL7 is at Vpgm and the channel is at Vss, writing is done. When data is not written, the channel is boosted to, for example, Vpass/2. When the number of cells to be written into is large, the channel is less easy to boost. However, in the writing method of self-boosting an erased area, data is always written from the source side. Therefore, when WL5 is set at 0 (WL5=0) and boosting is done, since the cells on WL8 to WL31 are erased, the channel is boosted, preventing data from being written. As described above, the boosted charge has to be prevented from moving to the cells already written into. However, when the cell selected by the word line WL5 is in the erased state and the threshold voltage is deep, that is, the threshold voltage has a large negative value, the cell does not turn off. Therefore, the threshold voltage of the cell has to be made shallow, that is, has to be a small negative threshold voltage.

Therefore, after the erase operation, all the word lines in the block are selected, a program operation and a program verify operation are carried out, and a write operation is performed to "z" level as shown in FIG. 8C. At this time, in the program operation and program verify operation, all the word lines are brought into the selected state and the potential of the selected word line in a verify operation is set at z+Vfix (e.g., 0 V). The rest are carried out completely in the same manner as in a normal program operation and program verify operation.

Figure 15A:
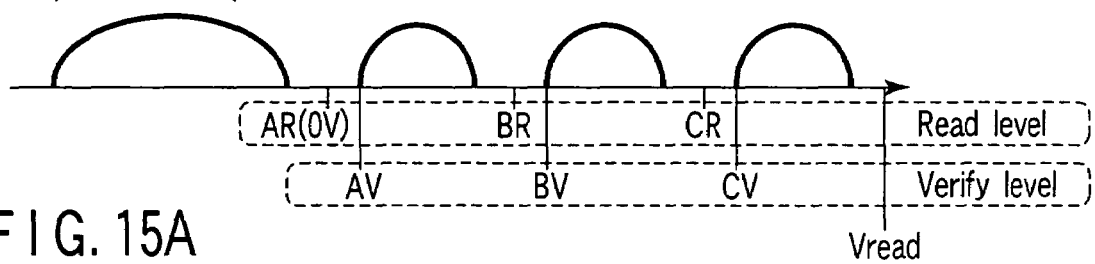
FIG. 15A shows the distribution of threshold voltages in a conventional writing method and FIG. 15B shows the distribution of threshold voltages in a writing method according to the first embodiment.
Figure 15B:
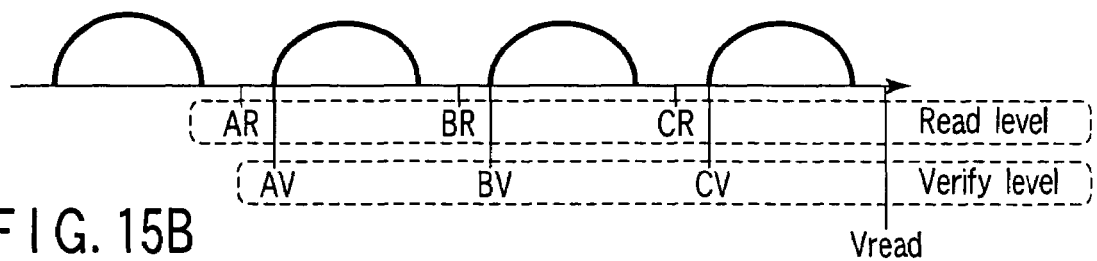

In the first embodiment, at least two items of multivalued data are set to negative threshold voltages. Therefore, as shown in FIG. 15B, the range of settable threshold voltages can be made wider in the range of the read voltage Vread than in a conventional case shown in FIG. 15A. Since the distribution width of one threshold voltage can be set wider, the number of program operations and verify operations can be decreased, which enables high-speed writing. The first embodiment is especially effective in storing 8-valued or 16-valued data in a single memory cell.

Furthermore, when a negative threshold voltage is read out, the constant voltage generating circuit 71 generates a voltage Vfix. The voltage Vfix is supplied to the source of the cell and well, thereby making the potentials of the source and well higher than the potential of the word line of the selected cell, which seemingly produces the same effect as when a negative voltage is applied to the word line. In addition, when the negative threshold voltage is read out, the source and well are short-circuited to the unselected bit lines, which enables the current flowing into the constant voltage generating circuit 71 to be decreased. This produces the effect of operating the constant voltage generating circuit 71 stably.

Moreover, in the first embodiment, it is not necessary to supply a negative voltage to the gates of the cells. Therefore, a high withstand voltage transistor constituting the row decoder need not be formed in the p-well. Accordingly, it is possible to prevent the manufacturing processes from increasing in number.

SECOND EMBODIMENT

Figure 11:
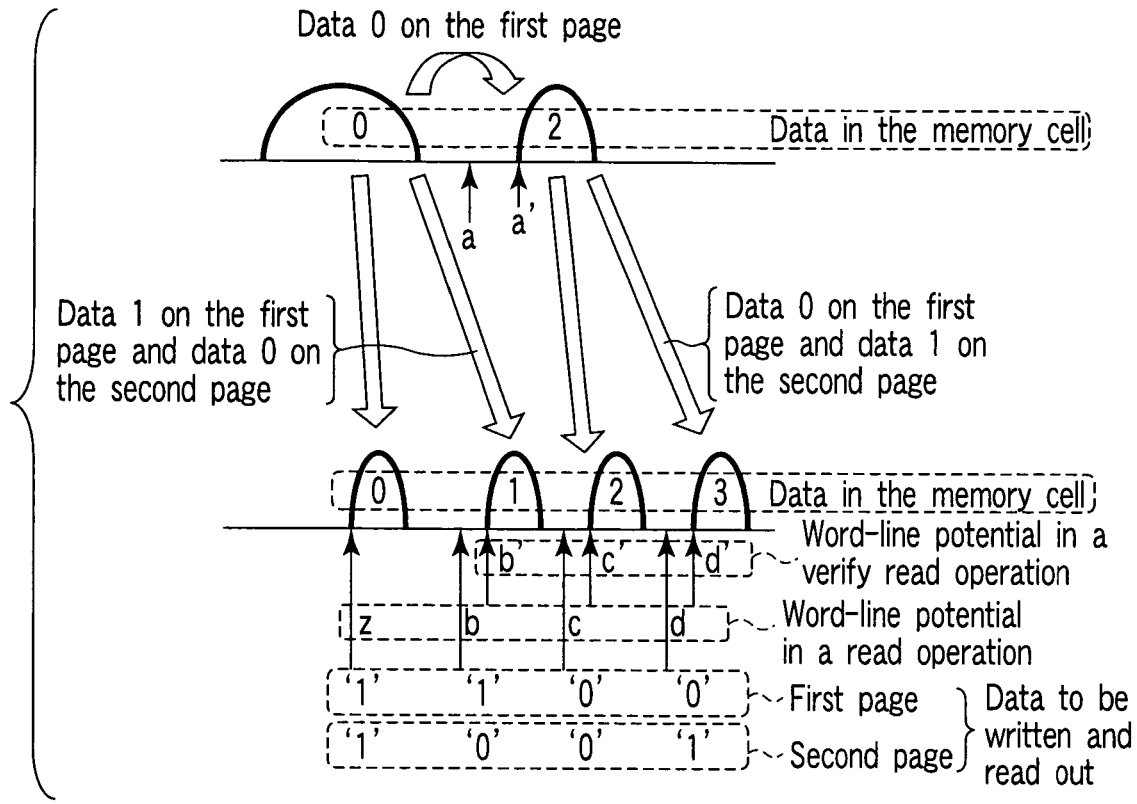
FIG. 11 is a diagram to help explain a 4-valued data write sequence.

In the first embodiment, the operation of setting the threshold voltage of an erased cell at −1.6 V is carried out during an erase sequence. However, as shown in FIG. 11, the operation may be carried out in the first page program or the second page program.

According to a second embodiment of the present invention, the erase operation can be made faster, although the program operation gets a little slower.

THIRD EMBODIMENT

In a positive read and a program verify operation and a negative read and a program verify operation in the first and second embodiments, when the voltage applied to the well of the selected cell, the source line, the unselected bit lines, and the select gates of the unselected blocks is negative, it is changed to Vfix (e.g., 1.6 V). When the voltage is positive, it is changed to Vss. The invention is not limited to this. For instance, when the voltage is positive, the voltage applied to the well of the selected cell, the source line, the unselected bit lines, and the select gates of the unselected blocks may be changed to Vfix as when the voltage is negative.

According to a third embodiment of the present invention, it is not necessary to change the read operation between a positive read and a negative read. Therefore, a positive read operation and a negative read operation can be carried out under the same conditions.

Furthermore, in the first and second embodiments, the positive read operation differs from the negative read operation, many threshold voltage margins have to be set. However, in the third embodiment, the read operation is always the same, making it unnecessary to set many threshold voltage margins. Thus, the distribution width of each threshold voltage of multivalued data can be made wider, which enables high-speed writing.

FOURTH EMBODIMENT

In the first embodiment, one data storage circuit is connected to two bit lines as shown in FIG. 3. This invention is not limited to this.

FIG. 16 shows the configuration of a memory cell array 1 and data storage circuits 10 according to a fourth embodiment of the present invention. Specifically, as shown in FIG. 16, it is possible to provide one data storage circuit 10 for one bit line. In this case, for example, a program writes data onto two bit lines simultaneously. In a verify read and a read operation, the data on one bit line is read and the other bit line is made unselected.

Since the fourth embodiment enables the number of cells written into simultaneously to be doubled, higher-speed writing can be done.

FIFTH EMBODIMENT

As in the fourth embodiment, in a fifth embodiment of the present invention, one data storage circuit 10 is connected to one bit line as shown in FIG. 16. A program writes data onto two bit lines simultaneously. In a verify read operation and in a read operation, the data on the two bit lines are read out. In this case, current flows into the source, the well, and the constant voltage generating circuit 71 (shown in FIG. 1) which is supplying an intermediate potential. However, to read the data on all the bit lines simultaneously in a verify read operation and in a read operation, for example, the time required for the current in the constant voltage generating circuit 71 to become stable is secured. Alternatively, first, the data is read from the cell with a larger current. Then, the cell with the larger current is excluded and the data is read again from the cell with a smaller current. This operation is repeated again.

The fifth embodiment can make the number of cells written into and read from twice as large as that in the first embodiment. Therefore, much higher-speed writing can be done.

While the above embodiments have been explained using 4-valued data, they may be applied to a semiconductor memory device which stores 8-valued, 16-valued, or n-valued (n is a natural number) data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array in which a plurality of memory cells are arranged in a matrix, the memory cells being connected to word lines and bit lines; and
    a control circuit which controls the potentials of the word lines and bit lines and which, when performing a read operation on the memory cell connected to a first one of the bit lines, supplies a first voltage to a second bit line provided next to the first bit line and to a source line of the memory cell array,
    wherein the control circuit, in the read operation, supplies a first precharge voltage to the first bit line and then supplies a specific voltage to the word lines, thereby reading a change in the potential on the bit line.

2. The semiconductor memory device according to claim 1, wherein the control circuit, when reading data from the memory cell connected to the first bit line, supplies the first voltage also to a well where the memory cell array is formed.

3. The semiconductor memory device according to claim 1, wherein the control circuit includes a constant voltage generating circuit which generates the first voltage.

4. The semiconductor memory device according to claim 3, further comprising:
    at least one first switch which is connected between the constant voltage generating circuit and the source line of the memory cell array.

5. The semiconductor memory device according to claim 4, further comprising:
    at least one second switch which is connected between the constant voltage generating circuit and the well of the memory cell array.

6. The semiconductor memory device according to claim 4, further comprising at least one third switch which is connected to the source line and which is turned on in an erase operation, thereby supplying an erase voltage to the source line and the well.

7. The semiconductor memory device according to claim 6, further comprising at least one fourth switch which is connected to the well and which is turned on in an erase operation, thereby supplying an erase voltage to the source line and the well.

8. The semiconductor memory device according to claim 1, wherein the first precharge voltage supplied to the first bit line is a voltage higher than the first voltage.

9. The semiconductor memory device according to claim 1, wherein the charge on the first bit line moves to the second bit line via the memory cell and source line.

10. The semiconductor memory device according to claim 1, wherein the first voltage is the ground voltage.

11. The semiconductor memory device according to claim 1, further comprising:
    a first transistor one end of which is connected to the bit line; and a capacitor one end of which is connected to the other end of the first transistor and the other end of which is supplied with a first signal, wherein the control circuit, when reading the potential on the first bit line, supplies a third voltage to one end of the capacitor and then changes the first signal from a low level to a high level, thereby raising the voltage at one end of the capacitor to a voltage higher than the third voltage, and applies a specific voltage to the gate of the first transistor, thereby reading the potential on the first bit line, and turns off the first transistor and then changes the first signal from the high level to the low level.

12. A semiconductor memory device comprising:

a memory cell array in which a plurality of memory cells are arranged in a matrix, the memory cells being connected to word lines and bit lines;

a control circuit which controls the potentials of the word lines, the bit lines, a source line, and a well; and a constant voltage generating circuit which generates a first voltage and a second voltage, wherein each of the memory cells has an n number of states, including a first state, a second state, . . . , an n-th state (n is a natural number equal to 2 or more) and the control circuit, when reading the first state, the second state, . . . , a k-th state ($k \leq n$ where k is a natural number), supplies the first voltage generated by the constant voltage generating circuit to the source line of the memory cell array and, when reading a (k+1)-th state to the n-th state, supplies the second voltage to the source line of the memory cell.

13. The semiconductor memory device according to claim 12, wherein the control circuit, when reading the first state, the second state, . . . , a k-th state ($k \leq n$ where k is a natural number), supplies the first voltage generated by the constant voltage generating circuit also to the well of the memory cell array and, when reading a (k+1)-th state to the n-th state, supplies the second voltage also to the well of the memory cell.

14. The semiconductor memory device according to claim 12, wherein the second voltage is lower than the first voltage.

15. The semiconductor memory device according to claim 12, wherein the control circuit, when reading the first state, the second state, . . . , a k-th state ($k \leq n$ where k is a natural number), supplies a first precharge voltage to the selected one of the bit lines and, when reading a (k+1)-th state to the n-th state, supplies a second precharge voltage to the selected bit line.

16. The semiconductor memory device according to claim 15, wherein the difference between the first precharge voltage and the first voltage is equal to the difference between the second precharge voltage and the second voltage.

17. The semiconductor memory device according to claim 12, wherein the control circuit, when reading data from the memory cell connected to a first one of the bit lines and when reading the first state, the second state, . . . , a k-th state ($k \leq n$ where k is a natural number), supplies the first voltage generated by the constant voltage generating circuit to a second bit line provided next to the first bit line and, when reading a (k+1)-th state to the n-th state, supplies the second precharge voltage to the second bit line.

18. The semiconductor memory device according to claim 12, further comprising a data storage circuit which stores data to be written into the memory cells and the data read from the memory cells.

19. The semiconductor memory device according to claim 18, wherein the data storage circuit is connected to either a pair of bit lines.

20. The semiconductor memory device according to claim 18, wherein the data storage circuit is connected to one bit line.

21. The semiconductor memory device according to claim 12, further comprising:

a first transistor one end of which is connected to the bit line; and a capacitor one end of which is connected to the other end of the first transistor and the other end of which is supplied with a first signal, wherein the control circuit, when reading the potential on the first bit line, supplies a third voltage to one end of the capacitor and then changes the first signal from a low level to a high level, thereby raising the voltage at one end of the capacitor to a voltage higher than the third voltage, and applies a specific voltage to the gate of the first transistor, thereby reading the potential on the first bit line, and turns off the first transistor and then changes the first signal from the high level to the low level.

22. A semiconductor memory device comprising:

a memory cell array in which a plurality of memory cells are arranged in a matrix, the memory cells being connected to word lines and bit lines; and a control circuit which controls the potentials of the word lines and bit lines and which, when performing a read operation on the memory cell connected to a first one of the bit lines, supplies a first voltage to a second bit line provided next to the first bit line and to a source line of the memory cell array, wherein the control circuit, in the read operation, supplies a predetermined voltage to the first bit line and supplies a specific voltage to the word lines, thereby reading a change in the potential on the bit line.

* * * * *